(12) United States Patent
Kim et al.

(10) Patent No.: US 12,298,671 B2
(45) Date of Patent: May 13, 2025

(54) ILLUMINATION CORRECTION APPARATUS

(71) Applicant: SAMSUNG ELECTRONICS CO., LTD., Suwon-si (KR)

(72) Inventors: Donghyeong Kim, Suwon-si (KR); Eunhee Jeang, Suwon-si (KR); Teun Boeren, Suwon-si (KR); Yoonsang Lee, Suwon-si (KR); Jeonggil Kim, Suwon-si (KR); Kyungbin Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 21 days.

(21) Appl. No.: 18/144,622

(22) Filed: May 8, 2023

(65) Prior Publication Data

US 2024/0069443 A1 Feb. 29, 2024

(30) Foreign Application Priority Data

Aug. 30, 2022 (KR) .......... 10-2022-0109016

(51) Int. Cl.
*G03F 7/00* (2006.01)
*G01J 1/42* (2006.01)
*H01L 21/027* (2006.01)

(52) U.S. Cl.
CPC ........ *G03F 7/70266* (2013.01); *G01J 1/4257* (2013.01); *G03F 7/70308* (2013.01); *G03F 7/70516* (2013.01); *G03F 7/706* (2013.01); *H01L 21/0274* (2013.01)

(58) Field of Classification Search
CPC ............ G03F 7/70075; G03F 7/70133; G03F 7/70266; G03F 7/70308; G03F 7/70516; G03F 7/706; G03F 7/7085; G03F 7/70141; G03F 7/70191; G03F 7/7055; G03F 7/70033; G01J 1/4257; H01L 21/0274

See application file for complete search history.

(56) References Cited

U.S. PATENT DOCUMENTS

| 8,587,767 | B2 | 11/2013 | Fiolka et al. |
| 9,110,378 | B2 | 8/2015 | Ossmann et al. |
| 10,845,706 | B2 | 11/2020 | Steeghs et al. |
| 10,884,339 | B2 | 1/2021 | Engelen et al. |

(Continued)

FOREIGN PATENT DOCUMENTS

JP 2015-185690 A 10/2015

*Primary Examiner* — Peter B Kim
(74) *Attorney, Agent, or Firm* — Sughrue Mion, PLLC

(57) ABSTRACT

An illumination correction apparatus for correcting a radiation beam incident on a reticle from an exposure apparatus includes a plurality of fingers each having a surface facing an incident direction of the radiation beam, the plurality of fingers being arranged in a first direction to be adjacent to a path of the radiation beam, and configured to adjust an amount of the incident radiation beam by moving in a second direction, intersecting the first direction, a controller connected to the plurality of fingers and configured to control movement of the plurality of fingers such that an intensity of the radiation beam has uniformity in the first direction, at least one optical sensor on the surface of at least one finger of the plurality of fingers, and a measurement unit configured to measure, based on an output of the at least one optical sensor, the intensity of the radiation beam.

20 Claims, 18 Drawing Sheets

(56) References Cited

U.S. PATENT DOCUMENTS

| | | |
|---|---|---|
| 11,204,556 B2 | 12/2021 | Huang et al. |
| 2009/0059190 A1 | 3/2009 | Tanaka et al. |
| 2010/0302525 A1* | 12/2010 | Zimmerman ........ G03F 7/70191 |
| | | 355/71 |
| 2011/0235015 A1* | 9/2011 | Dengel ................ G03F 7/70141 |
| | | 355/71 |
| 2020/0133142 A1* | 4/2020 | Lu ........................ G03F 7/70891 |
| 2020/0387076 A1* | 12/2020 | Looman .............. G03F 7/70891 |
| 2022/0086998 A1 | 3/2022 | Rafac |

* cited by examiner

ILLUMINATION CORRECTION APPARATUS

CROSS-REFERENCE TO RELATED APPLICATION(S)

This application is based on and claims priority under 35 U.S.C. § 119 to Korean Patent Application No. 10-2022-0109016 filed on Aug. 30, 2022 in the Korean Intellectual Property Office, the disclosure of which is incorporated by reference herein in its entirety.

BACKGROUND

The disclosure relates to an illumination correction apparatus and an exposure apparatus including the same.

An exposure apparatus is a machine applying a desired pattern onto a wafer. The wafer may be transferred onto a target portion of a substrate. The transfer of the pattern is generally performed via imaging onto a resist layer provided on the wafer.

The exposure apparatus may include a radiation source generating a radiation beam having a predetermined wavelength, and a scanner transmitting the radiation beam to finally transfer a pattern on a reticle to a wafer. The scanner may include an optical system for transmitting the radiation beam, and the optical system may include an illumination correction apparatus for correcting non-uniformity of the radiation beam before the radiation beam is incident on the reticle. For example, the illumination correction apparatus may include actuating fingers for covering an edge of the radiation beam in order to correct a variation in position-dependent intensity of the radiation beam.

SUMMARY

An aspect of the disclosure provides an illumination correction apparatus for measuring an intensity of a radiation beam incident on a reticle on a path of the radiation beam.

Another aspect of the disclosure provides an exposure apparatus for calculating a degree of power loss of an optical system by measuring an intensity of a radiation beam incident on a reticle.

Another aspect of the disclosure provides an exposure apparatus for detecting abnormality in aberration and alignment of an optical system by measuring an intensity of a radiation beam incident on a reticle.

In accordance with an aspect of the disclosure, an illumination correction apparatus configured to correct a radiation beam incident on a reticle from an exposure apparatus includes a plurality of fingers each having a surface facing an incident direction of the radiation beam, the plurality of fingers being arranged in a first direction to be adjacent to a path of the radiation beam, and configured to adjust an amount of the incident radiation beam by moving in a second direction, intersecting the first direction; a controller connected to the plurality of fingers and configured to control movement of the plurality of fingers such that an intensity of the radiation beam has uniformity in the first direction; at least one optical sensor on the surface of at least one finger of the plurality of fingers; and a measurement unit configured to measure, based on an output of the at least one optical sensor, the intensity of the radiation beam.

In accordance with an aspect of the disclosure, an illumination correction apparatus configured to correct a radiation beam incident on a reticle from an exposure apparatus, the illumination correction apparatus includes a plurality of fingers configured to adjust an intensity of the radiation beam incident on the reticle with movement of the plurality of fingers in a predetermined direction; an energy sensor adjacent to the plurality of fingers; and a plurality of optical sensors on a surface of at least one finger, among the plurality of fingers, wherein the illumination correction apparatus is configured to measure the intensity of the radiation beam on a reticle level using the energy sensor and the plurality of optical sensors, and the intensity of the radiation beam on the reticle level is used to monitor energy transmission efficiency of a projection system of the exposure apparatus.

In accordance with an aspect of the disclosure, an illumination correction apparatus configured to correct a radiation beam incident on a reticle from an exposure apparatus, the illumination correction apparatus includes a plurality of fingers configured to adjust an amount of the radiation beam incident on the reticle with movement of the plurality of fingers in a predetermined direction; an energy sensor adjacent to the plurality of fingers; and a plurality of optical sensors on a surface of at least one finger, among the plurality of fingers, wherein the illumination correction apparatus is configured to measure a reticle-level intensity profile representing a position-dependent intensity of the radiation beam incident on the reticle using the energy sensor and the plurality of optical sensors, and the reticle-level intensity profile is used to monitor whether there is an abnormality in aberration or alignment of the projection system.

In accordance with an aspect of the disclosure, an exposure apparatus includes a radiation source configured to output a radiation beam; a reticle stage on which a reticle including optical patterns is mounted; a wafer stage on which a wafer is mounted; an illumination system configured to transmit a radiation beam output from the radiation source to the reticle; an illumination correction apparatus configured to correct uniformity of the radiation beam incident on the reticle from the illumination system; and a projection system configured to transmit the radiation beam reflected from the reticle to the wafer, wherein the illumination correction apparatus includes a plurality of fingers configured to adjust an intensity of the radiation beam incident on the reticle with movement of the plurality of fingers in a predetermined direction, an energy sensor adjacent to the plurality of fingers, and a plurality of optical sensors on a surface of at least one finger, among the plurality of fingers, and wherein the illumination correction apparatus is configured to measure the intensity of the radiation beam on a reticle level using the energy sensor and the plurality of optical sensors.

In accordance with an aspect of the disclosure, an exposure apparatus includes a radiation source configured to output a radiation beam; a reticle stage on which a reticle including optical patterns is mounted; a wafer stage on which a wafer is mounted, the wafer stage including a slit-spot sensor configured to measure a wafer-level intensity profile representing a position-dependent intensity of a radiation beam incident on the wafer; an illumination system configured to transmit the radiation beam output from the radiation source to the reticle; an illumination correction apparatus configured to correct uniformity of the radiation beam incident on the reticle from the illumination system; a projection system configured to transmit the radiation beam reflected from the reticle to the wafer; and a monitoring unit configured to monitor whether the projection system is abnormal, wherein the illumination correction apparatus includes a plurality of fingers configured to adjust an amount of the radiation beam incident on the reticle with movement of the plurality of fingers in a predetermined direction, an energy sensor adjacent to the plurality of fingers, and a plurality of optical sensors on a surface of at least one finger, among the plurality of fingers, wherein the illumination correction apparatus is configured to measure a reticle-level intensity profile representing a position-dependent intensity of the radiation beam incident on the reticle using the energy sensor and the plurality of optical sensors, and the monitoring unit is configured to monitor whether there is an abnormality in aberration or alignment of the projection system according to a result of comparing the wafer-level intensity profile and the reticle-level intensity profile to each other.

According to example embodiments of the disclosure, an illumination correction apparatus may place an optical sensor on a surface of each of actuating fingers, and actuate the actuating fingers to expose the optical sensor to a radiation beam, thereby measuring an intensity of a radiation beam incident on a reticle on a path of the radiation beam.

According to example embodiments of the disclosure, an exposure apparatus may calculate a degree of power loss of an optical system based on an intensity of a radiation beam measured by the illumination correction apparatus and an intensity of a radiation beam measured by a wafer.

According to example embodiments of the disclosure, the exposure apparatus may detect an abnormality in aberration and alignment of illumination light, based on the intensity of the radiation beam measured by the illumination correction apparatus and the intensity of the radiation beam measured by the wafer.

The issues to be resolved by the disclosure are not limited to the issue described above, and other issues not described will be clearly understood by those skilled in the art from the following description.

BRIEF DESCRIPTION OF DRAWINGS

The above and other aspects, features, and advantages of the disclosure will be more clearly understood from the following detailed description, taken in conjunction with the accompanying drawings, in which.

DETAILED DESCRIPTION

Hereinafter, preferred example embodiments of the disclosure will be described with reference to the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For the sake of brevity, conventional elements to semiconductor devices may or may not be described in detail herein for brevity purposes.

Figure 1:
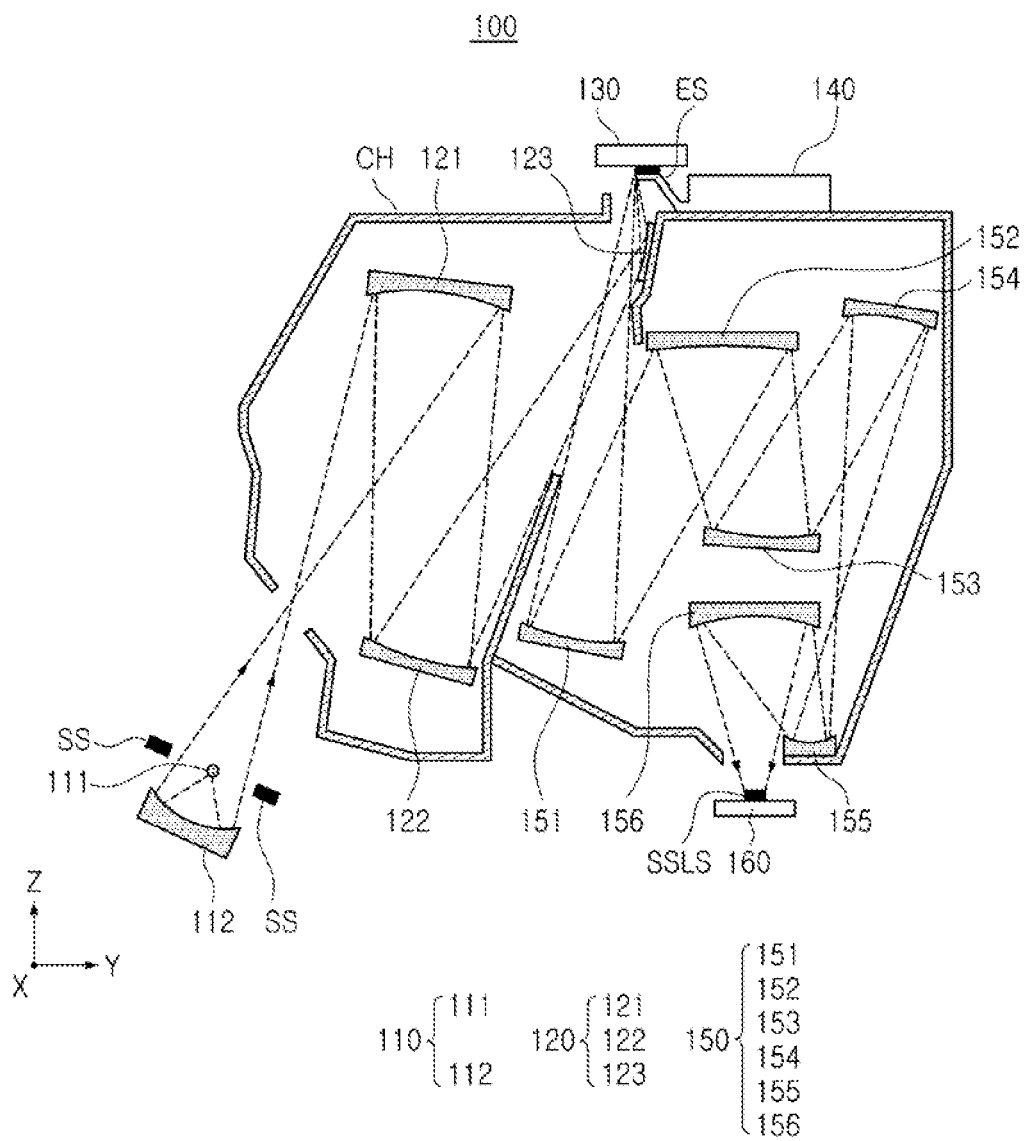
FIG. 1 is a diagram illustrating a structure of an exposure apparatus.

FIG. 1 is a diagram illustrating a structure of an exposure apparatus.

Referring to FIG. 1, an exposure apparatus 100 may include a radiation source 110, an illumination system 120, a reticle stage 130, an illumination correction apparatus 140, a projection system 150, a wafer stage 160, and optical sensors SS, ES, and SSLS.

The exposure apparatus 100 may be an apparatus performing an exposure operation of creating a pattern on a wafer by irradiating a radiation beam onto the wafer. In order to form a fine semiconductor pattern on the wafer, exposure technology using radiation having a gradually shorter wavelength has been researched, developed, and used. For example, the exposure apparatus 100 may perform an exposure operation using an extreme ultraviolet (EUV) beam having a wavelength of 13.5 nm.

The radiation source 110 may generate a radiation beam, for example an EUV beam. The radiation source 110 may include a droplet 111 and a mirror 112. For example, the droplet 111 may be formed of liquid tin (Sn). The radiation source 110 may irradiate the droplet 111 with a laser beam to generate plasma, condense an EUV beam generated from the plasma using the mirror 112, and transmit the condensed beam to the illumination system 120.

The illumination system 120 may transfer the radiation beam output from the radiation source 110 to the reticle stage 130. The illumination system 120 may include mirrors 121, 122, and 123. The illumination system 120 may transmit the radiation beam output from the radiation source 110 to the reticle stage 130 by reflecting the radiation beam to the mirrors 121, 122, and 123.

The reticle stage 130 may be configured to mount a reticle including optical patterns. The reticle stage 130 may move in a first direction X or a second direction Y such that the radiation beam transmitted from the illumination system 120 may be accurately incident on the reticle. The radiation beam incident on the reticle may be patterned by the optical patterns included in the reticle, and may be reflected from the reticle. That is, light reflected from the reticle may include information about the optical patterns.

The illumination correction apparatus 140 may be disposed between illumination system 120 and the reticle stage 130 on a path of the radiation beam. The illumination correction apparatus 140, an apparatus for correcting an intensity of a radiation beam incident on the reticle stage 130 from the illumination system 120 such that the intensity of the radiation beam becomes uniform, may be referred to as a UNICOM.

The illumination correction apparatus 140 may include a plurality of fingers arranged in the first direction X and moving in the second direction Y. The plurality of fingers may move in the second direction Y to cover an edge of the radiation beam. The illumination correction apparatus 140 may move at least some of the plurality of fingers to adjust the intensity of the radiation beam, such that a slit-shaped radiation beam extending in the first direction X may have a uniform intensity in any position in the first direction X. That is, the plurality of fingers may serve as an aperture of the radiation beam.

The projection system 150 may transmit the radiation beam reflected from the reticle to the wafer stage 160 on which a wafer is mounted. The projection system 150 may include mirrors 151 to 156. The projection system 150 may use mirrors 151 to 156 to transmit a radiation beam output from the reticle to the wafer stage 160. The projection system 150 may also be referred to as a projection optics box (POB).

The wafer stage 160 may move in the first direction X or the second direction Y such that the radiation beam transmitted from the projection system 150 is accurately incident on the wafer. A photosensitive material may be applied onto the wafer. The radiation beam transmitted from projection system 150 may include information about the optical patterns on the reticle. The photosensitive material applied onto the wafer may be selectively dissolved in response to the radiation beam to form a pattern identical to the optical pattern or a reduced optical pattern.

The illumination system 120 and the projection system 150 may be included in an optical system transmitting the radiation beam output from the radiation source 110 to the wafer. In order to normally form a pattern on the wafer using the radiation beam transmitted to the wafer, sufficient energy may need to be transmitted onto the wafer through the radiation beam.

As the radiation beam has a shorter wavelength, an amount of the radiation beam absorbed by a medium may be increased and energy of the radiation beam transmitted to the wafer may be reduced during transmission of the radiation beam. Therefore, in order to reduce the amount of the radiation beam absorbed by the medium when the radiation beam is an EUV beam, the optical system may be disposed in a chamber CH that is in a vacuum state. In addition, the optical system may be configured using a mirror transmitting the radiation beam by reflecting the radiation beam instead of a lens absorbing the radiation beam.

As a period in which the optical system is used becomes longer, the optical system may be contaminated and may have degraded performance. When the performance of the optical system is degraded, the energy of the radiation beam transmitted to the wafer may be reduced, and a pattern may not be normally formed on the wafer, resulting in a reduction in yield of the wafer.

The reduction in the energy of the radiation beam transmitted to the wafer may be due to contamination of the illumination system 120 or the projection system 150 inside the optical system, or instability of the radiation beam output from the radiation source 110 outside the optical system. In order to maintain the yield of the wafer, it may be desirable to detect degradation of the illumination system 120 and the projection system 150 in a timely manner, and to repair or replace the illumination system 120 or the projection system 150.

When the projection system 150 has low energy transmission efficiency, degradation of the projection system 150 may be detected. When energy of the radiation beam incident on the reticle and energy of the radiation beam incident on the wafer are measurable, the energy transmission efficiency of the projection system 150 may be accurately calculated.

The exposure apparatus 100 may have optical sensors in various positions to measure the intensity of the radiation beam. For example, the exposure apparatus 100 may include a side sensor SS disposed around the droplet 111, an energy sensor ES disposed to be adjacent to the plurality of fingers of the illumination correction apparatus 140, and a slit-spot sensor SSLS disposed on the wafer stage 160. For example, the side sensor SS may measure an intensity of plasma generated in the droplet 111, the energy sensor ES may measure an intensity at opposite ends of a radiation beam output by the illumination system 120, and the slit-spot sensor SSLS may measure an intensity of a radiation beam incident on the wafer. The energy of the radiation beam may be calculated based on the intensity of the radiation beam.

The energy sensor ES may be disposed at opposite ends of the arrangement of fingers of the illumination correction apparatus 140 (see, e.g., FIG. 4), and may measure an intensity of the radiation beam in a position of the radiation beam not actually incident on the reticle.

A position-dependent intensity of the radiation beam output by the illumination system 120 may change over time, such that energy measured by the energy sensor ES may be different from energy of the radiation beam actually incident on the reticle. When the energy transmission efficiency of the projection system 150 is calculated based on the energy measured by the energy sensor ES and energy measured by the slit-spot sensor SSLS, accuracy of the energy transmission efficiency may be reduced.

However, when an optical sensor having a fixed position is disposed on the path of the radiation beam to directly measure the energy of the radiation beam actually incident on the reticle, the energy of the radiation beam may be absorbed by the optical sensor, and accordingly energy transmission efficiency of the optical system may be further reduced.

According to an example embodiment of the present disclosure, the exposure apparatus 100 may further include finger sensors disposed on surfaces of the fingers of the illumination correction apparatus 140. The finger sensors may be implemented as optical sensors, for example, photodiodes. The finger sensors may be selectively placed on the path of the radiation beam depending on movement of the fingers.

The finger sensors may measure the intensity of the radiation beam on the path of the radiation beam incident on the reticle, thereby more accurately measuring the energy of the radiation beam incident on the reticle. However, the radiation beam actually incident on the reticle during an exposure operation may not be covered by the finger sensors, thereby maintaining energy efficiency of the optical system.

According to an example embodiment of the disclosure, the exposure apparatus 100 may accurately calculate, based on the energy of the radiation beam incident on the reticle and the energy of the radiation beam incident on the wafer, the energy transmission efficiency of the projection system 150, without adversely affecting the yield of the wafer. As a result, a degree of the degradation of the projection system 150 of the exposure apparatus 100 may be accurately determined, such that maintenance or replacement of the projection system 150 may be performed in a timely manner, and the yield of the wafer may be improved.

Figure 2:
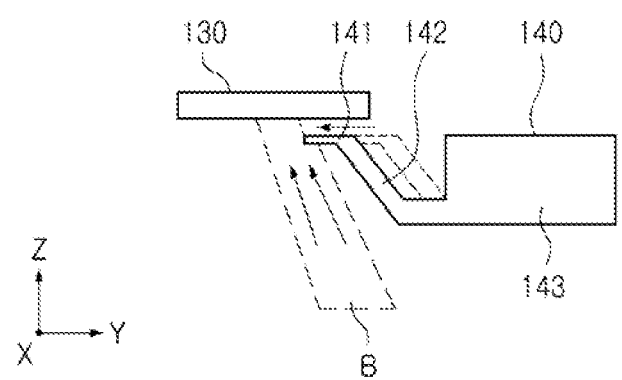
FIGS. 2, 3A, 3B, and 4 are diagrams specifically illustrating a structure and operation of an illumination correction apparatus.

FIG. 2 is an enlarged plan view of a reticle stage 130 and the illumination correction apparatus 140 described with reference to FIG. 1. In FIG. 2, the energy sensor ES and the finger sensors that may be included in the illumination correction apparatus 140 are omitted.

Referring to FIG. 2, the illumination correction apparatus 140 may include a plurality of fingers, a connection unit 142 and a controller 143. The plurality of fingers may be arranged in the first direction X. FIG. 2, a plan view of the reticle stage 130 and the illumination correction apparatus 140 on a Y-Z plane, illustrates only one finger 141 among the plurality of fingers.

A radiation beam B output from an illumination system 120 may be incident on the reticle stage 130. A plurality of fingers 141 may be disposed to be adjacent to an incident path of the radiation beam B. At least some of the plurality of fingers 141 may move in a second direction Y to cover an edge of the radiation beam B, thereby adjusting an intensity of the radiation beam B incident on a reticle.

The plurality of fingers 141 may be connected to the controller 143 through the connection unit 142. The controller 143 may correct the intensity of the radiation beam B such that the intensity of the radiation beam B becomes uniform in the first direction X by controlling the movement of the plurality of fingers 141.

Figure 3A:
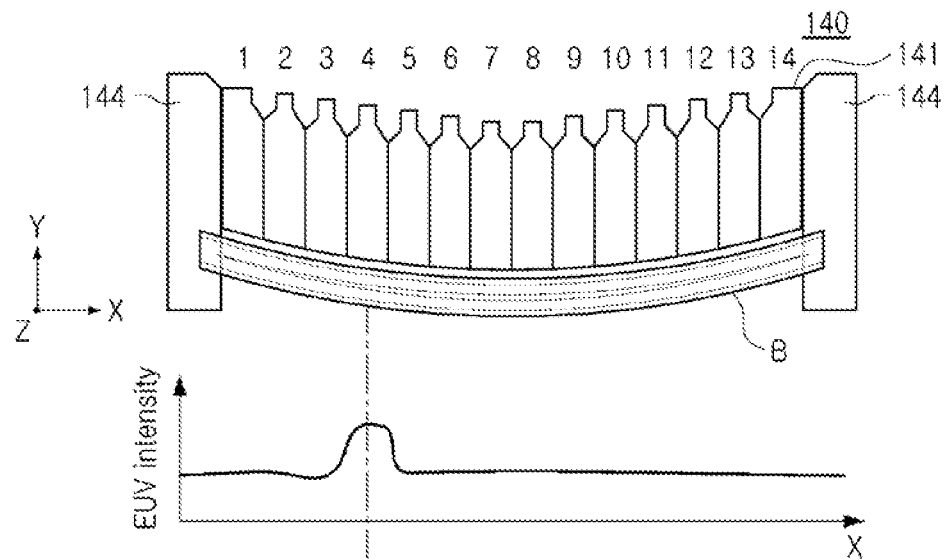
Figure 3B:
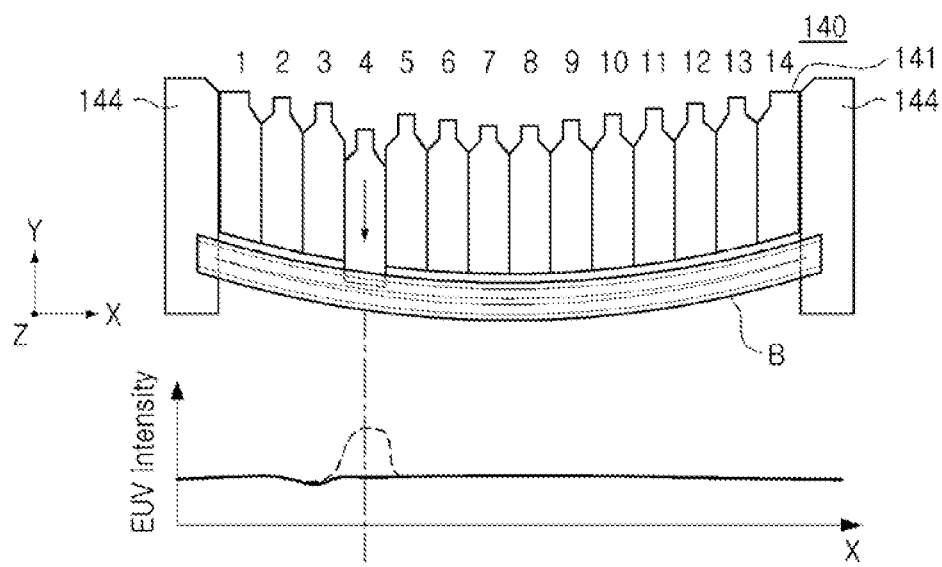

FIGS. 3A and 3B are enlarged plan views of a portion of the illumination correction apparatus 140.

First, referring to FIG. 3A, the illumination correction apparatus 140 may further include the plurality of fingers 141 arranged in the first direction X, and a support 144 surrounding the plurality of fingers 141 in the first direction X.

The plurality of fingers 141 may be disposed to be adjacent to an incident path of the radiation beam B. The radiation beam B may have an arcuate shape. Distal edges of the plurality of fingers 141 may have an inclined shape depending on a curvature of the radiation beam B.

FIG. 3A also illustrates a graph illustrating an intensity of the radiation beam B depending on a position in the first direction X. The intensity of the radiation beam B may be proportional to energy of the radiation beam B.

When the intensity of the radiation beam B transmitted to the reticle is not uniform depending on a position thereof, optical patterns of the reticle may be patterned with a non-uniform intensity depending on positions of the optical patterns. Accordingly, the radiation beam B transmitted to the reticle may be required to have a uniform intensity in any position in the first direction X. In the example of FIG. 3A, non-uniformity may occur in which an intensity of the radiation beam B in a position of a fourth finger in the first direction X is higher than an intensity of the radiation beam B in the other positions.

Referring to FIG. 3B, the illumination correction apparatus 140 may cover an edge of the radiation beam B in a position in which an intensity of the radiation beam B is higher by moving the fourth finger in a second direction Y. Referring to the graph of FIG. 3B, a portion of the radiation beam B may be covered, such that an intensity of a radiation beam incident on the reticle in the position may be lowered, and the radiation beam B may have a uniform intensity in all positions in the first direction X.

The illumination correction apparatus may include at least one energy sensor to measure the intensity of the radiation beam B.

Figure 4:
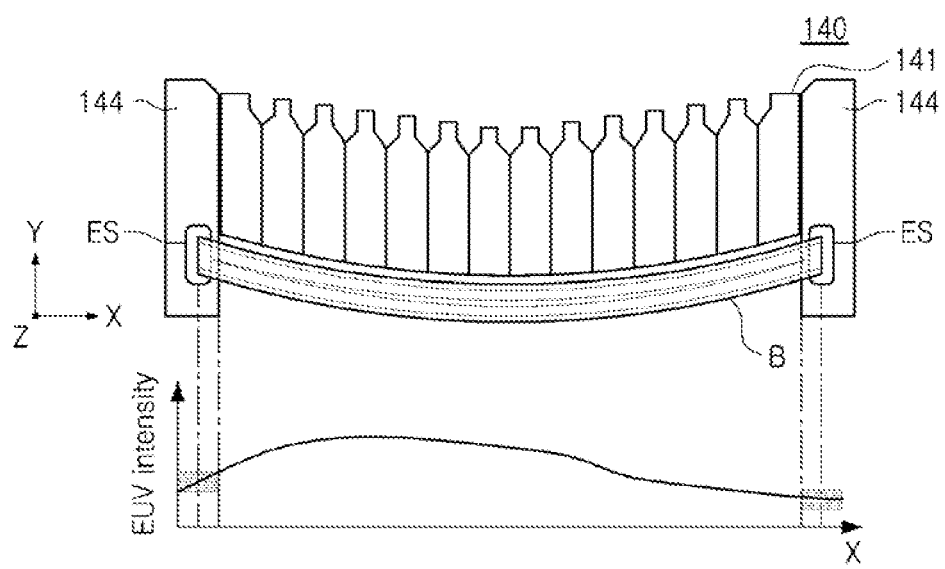

FIG. 4 is a diagram illustrating an energy sensor of an illumination correction apparatus.

Referring to FIG. 4, the illumination correction apparatus 140 may include a plurality of fingers 141, the support 144, and the energy sensors ES attached to a surface of the support 144.

The radiation beam B may have opposite ends covered by the support 144 all the time and a main portion selectively covered by the plurality of fingers 141. Energy of the opposite ends of the radiation beam B may not be transmitted to a reticle, and energy of the main portion may be transmitted to the reticle.

The energy of the opposite ends of the radiation beam B may not be transmitted to the reticle. Even when an intensity at the opposite ends of the radiation beam B is measured using the energy sensors ES, the energy transmitted to the reticle through the radiation beam B may not be reduced due to the measurement of the intensities. However, the energy transmitted to the reticle may not be accurately calculated by measuring the intensity only at the opposite ends of the radiation beam B.

FIG. 4 is a graph illustrating an intensity of the radiation beam B depending on a position in the first direction X. A shaded portion in the graph represents an intensity of the radiation beam B in a position measurable by the energy sensors ES. The intensity of the radiation beam B may not be uniform depending on a position in the first direction X. That is, an intensity of the radiation beam B at opposite ends being measurable by the energy sensors ES may be different from the intensity of the radiation beam B in a main portion being not measurable by the energy sensors ES. In addition, the intensity of the radiation beam B depending on the position in the first direction X may change over time, such that it may be also difficult to estimate the intensity of the radiation beam B in the main portion based on the intensities of the radiation beam B at the opposite ends.

According to an example embodiment of the disclosure, a plurality of optical sensors may be attached to surfaces of the plurality of fingers 141. The illumination correction apparatus 140 may allow the plurality optical sensors to be disposed on a path of the radiation beam B incident on a reticle by moving the fingers 141, and the intensity of the radiation beam B may be measured on the path of the radiation beam B. Accordingly, energy of the radiation beam B transmitted to the reticle may be more accurately measured.

Figure 5A:
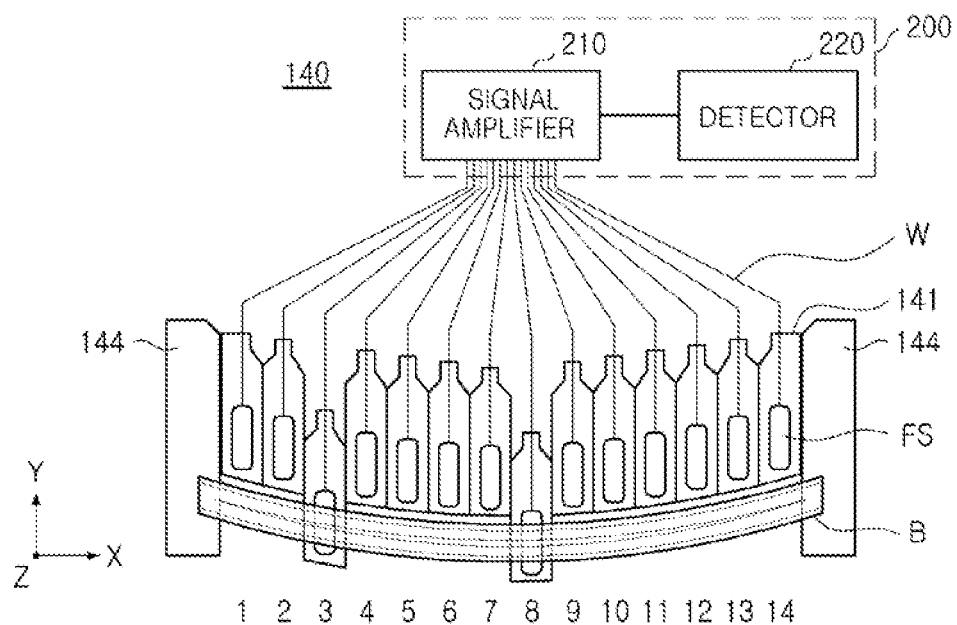
FIGS. 5A to 5C are diagrams illustrating an illumination correction apparatus according to an example embodiment of the disclosure.
Figure 5B:
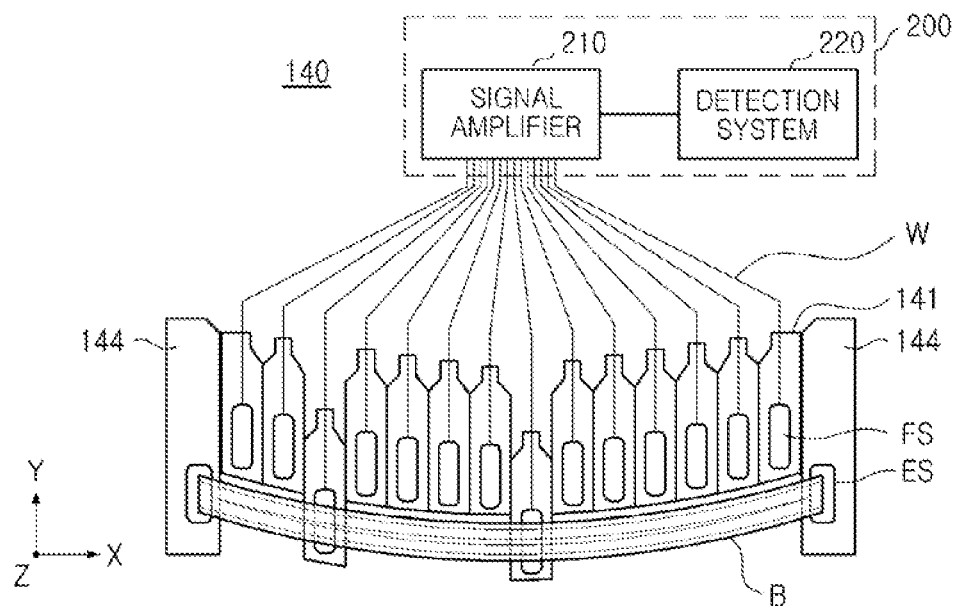
Figure 5C:
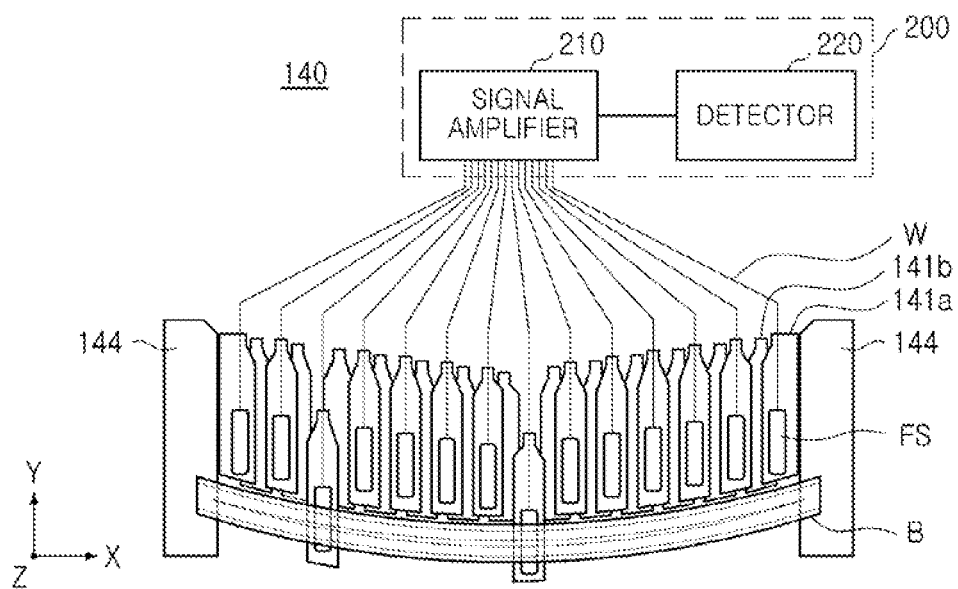

FIGS. 5A to 5C are diagrams illustrating an illumination correction apparatus according to an example embodiment of the disclosure.

Referring to FIG. 5A, the illumination correction apparatus 140 may include the plurality of fingers 141 and the support 144. The illumination correction apparatus 140 may further include finger sensors FS, a measurement unit 200, and wires W electrically connecting the finger sensors FS to the measurement unit 200. The illumination correction apparatus 140 may further include the connection unit 142 and the controller 143 as described with reference to FIG. 2, but are omitted in FIG. 5A.

The finger sensors FS may be implemented as optical sensors, for example, photodiodes. When the exposure apparatus 100 is an apparatus performing an exposure operation using an EUV beam, a photodiode may be implemented to measure characteristics of the EUV beam. For example, the photodiode may perform photoelectric conversion on a radiation beam of 10 nm to 30 nm, including a wavelength band of the EUV beam. The photodiode may include a P-N junction. The photodiode may provide an output representing an intensity of a radiation beam incident on the photodiode. For example, the photodiode may perform photoelectric conversion to generate electric charge depending on the intensity of the radiation beam.

The finger sensor FS may have a width narrower than that of the finger 141 in the first direction X. For example, when fourteen fingers 141 are disposed in a width of 104 mm, the width of the finger sensor FS may be determined to be within 7.4 mm. Preferably, the finger sensor FS may have a length of 1 μm or more and 1 cm or less in the first direction X.

The illumination correction apparatus 140 may further include a mirror oriented toward a surface of the finger sensor FS. The mirror may condense the radiation beam B output from the illumination system 120, and may output the condensed radiation beam B to the finger sensor FS.

The controller 143 of the illumination correction apparatus 140 may control movement of the plurality of fingers 141 such that the finger sensors FS are placed on an incident path of the radiation beam B. When the finger sensors FS are exposed to the radiation beam B, an output depending on an intensity of the radiation beam B may be generated. In the example of FIG. 5A, a third finger and an eighth finger among the plurality of fingers 141 may move in the second direction Y to be exposed to the radiation beam B. In this case, outputs depending on intensities of the radiation beam B in positions of the third finger and the eighth finger in the first direction X may be generated.

The measurement unit 200 may output, based on outputs from the finger sensors FS, the intensity of the radiation beam B. Specifically, the measurement unit 200 may include a signal amplifier 210 and a detector 220. The signal amplifier 210 may output a voltage signal or a current signal by amplifying a signal photoelectrically converted from the finger sensors FS. The signal amplifier 210 may include a noise removal function, and may output a signal from which noise is removed from the photoelectrically converted signal.

The detector 220 may convert the signal output from the signal amplifier 210 into a digital signal, and may convert the digital signal into an intensity value of the radiation beam B by applying a predetermined conversion factor to the digital signal. The detector 220 may generate, based on an intensity of the radiation beam B obtained from each of the finger sensors FS, an intensity profile representing an intensity of the radiation beam B depending on a position in the first direction X.

The illumination correction apparatus 140 may measure an intensity in a main portion of the radiation beam B by moving the plurality of fingers 141. However, positions of the plurality of fingers 141 may be determined to maintain uniformity of the radiation beam B during an exposure operation of the exposure apparatus 100, such that it may be difficult to measure the intensity in the main portion in real time by arbitrarily moving the plurality of fingers 141.

Referring to FIG. 5B, the illumination correction apparatus 140 may further include the energy sensors ES as described with reference to FIG. 4, in addition to the finger sensors FS, the measurement unit 200, and the wires W. The energy sensors ES may measure an intensity at opposite ends of the radiation beam B in real time regardless of whether the exposure apparatus 100 is in an exposure operation. The energy sensors ES may complement the finger sensors FS such that the illumination correction apparatus 140 measures an intensity of the radiation beam B in real time.

FIGS. 5A and 5B illustrate a case in which the plurality of fingers 141 are closely disposed in the first direction X. However, the disclosure is not limited thereto. For example, the plurality of fingers 141 may be configured as a plurality of fingers disposed to be offset from each other so as to secure a smooth driving space while allowing the intensity of the radiation beam B to be controlled in any position in the first direction X.

The illumination correction apparatus 140 illustrated in FIG. 5C may have a structure similar to that of the illumination correction apparatus 140 described with reference to FIG. 5A. However, the illumination correction apparatus 140 of FIG. 5C may include a plurality of fingers 141a included in a first layer disposed to be relatively close to an incident direction of the radiation beam B, and a plurality of fingers 141b included in a second layer disposed to be relatively far in the incident direction of the radiation beam B. Depending on implementation, the finger sensors FS may be disposed on surfaces of the plurality of fingers 141a included in the first layer.

Figure 6:
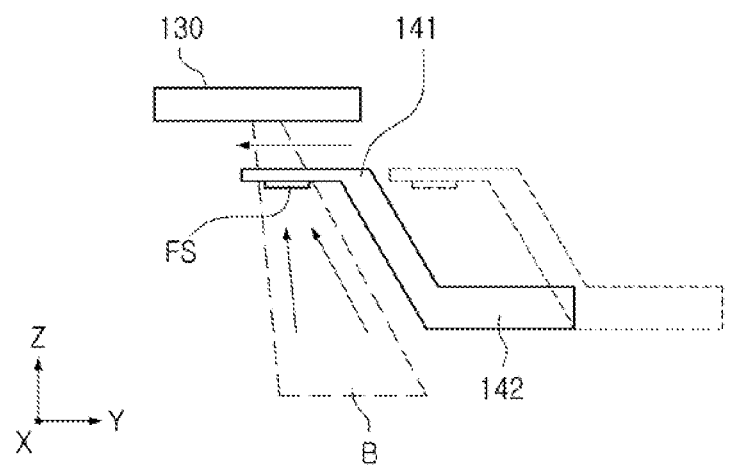
FIGS. 6 and 7 are diagrams illustrating an operation of an illumination correction apparatus according to an example embodiment of the disclosure.

FIG. 6 is an enlarged plan view of a portion of an exposure apparatus according to an example embodiment of the disclosure.

FIG. 6 illustrates the reticle stage 130 of the exposure apparatus 100, the finger 141 and the connection unit 142 of the illumination correction apparatus 140.

The finger 141 may have a surface oriented in an incident direction of the radiation beam B. In other words, the finger 141 may have a surface facing the incident direction such that the incident radiation beam B is incident on the surface of the finger 141. The finger sensor FS may be attached to the surface. The illumination correction apparatus 140 may expose the finger sensor FS to the radiation beam B by moving the finger 141 in the second direction Y. When the finger sensor FS is exposed to the radiation beam B, the finger sensor FS may generate an output depending on an intensity of the radiation beam B.

Figure 7:
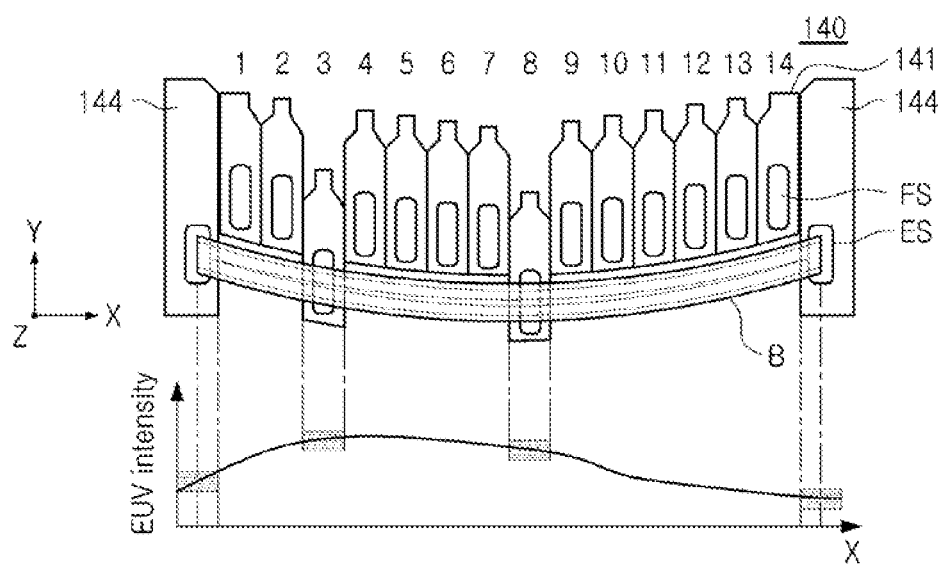

FIG. 7 illustrates the illumination correction apparatus 140, the radiation beam B, and a graph illustrating an intensity of the radiation beam B depending on a position in the first direction X.

Referring to FIG. 7, when an intensity in a main portion of the radiation beam B is measured by the finger sensors FS of third and eighth fingers, an intensity at opposite ends of the radiation beam B may be measured by the energy sensors ES. In the graph of FIG. 7, a shaded portion represents a position in the first direction X in which an intensity of the radiation beam B is measured.

According to an example embodiment of the disclosure, a proportional constant between the intensity in the main portion and the intensity in the opposite ends may be updated based on the intensity in the main portion measured by the finger sensors FS and the intensity at the opposite ends measured by the energy sensors ES. Even when it is difficult to measure the intensity in the main portion in real time, the intensity in the main portion may be estimated in real time using the intensity at the opposite ends and the proportional constant. In addition, energy transmission efficiency of the projection system 150 may be calculated based on the estimated intensity in the main portion, and the presence or absence of an abnormality in aberration or alignment of the projection system 150 may be detected.

Figure 8A:
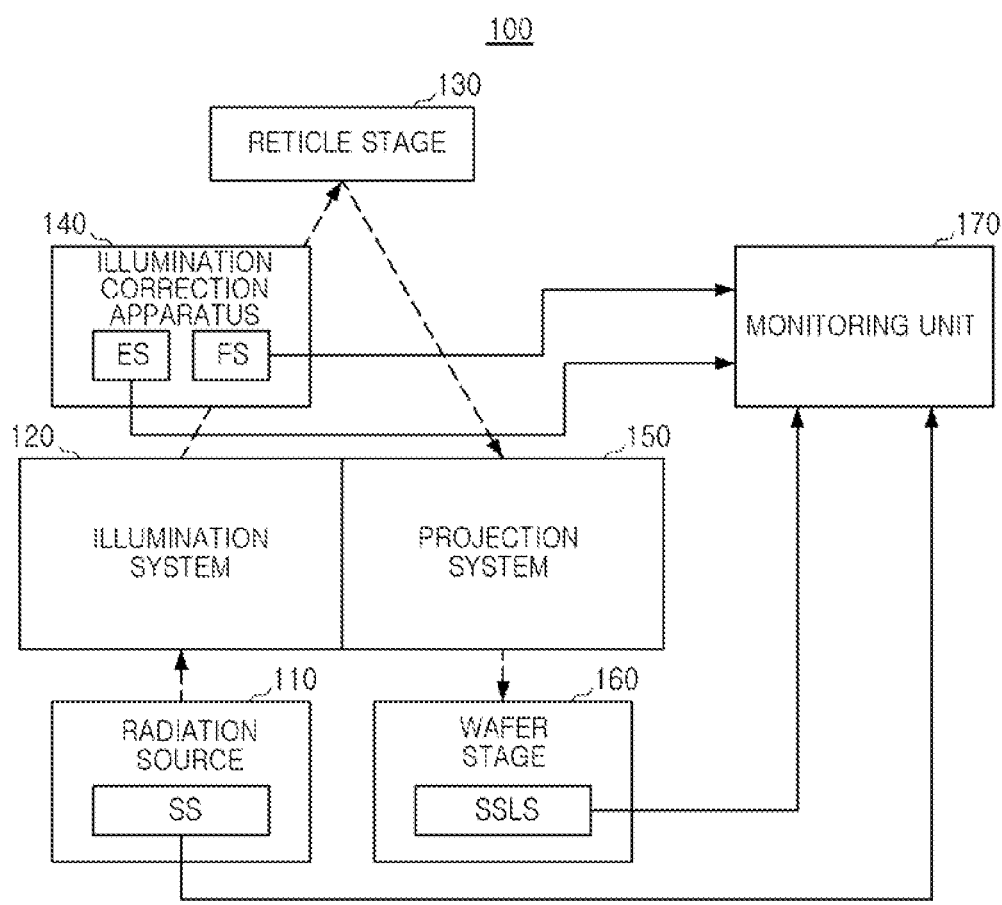
FIGS. 8A to 8C are diagrams illustrating a method of detecting whether a projection system is abnormal according to an example embodiment of the disclosure.
Figure 8B:
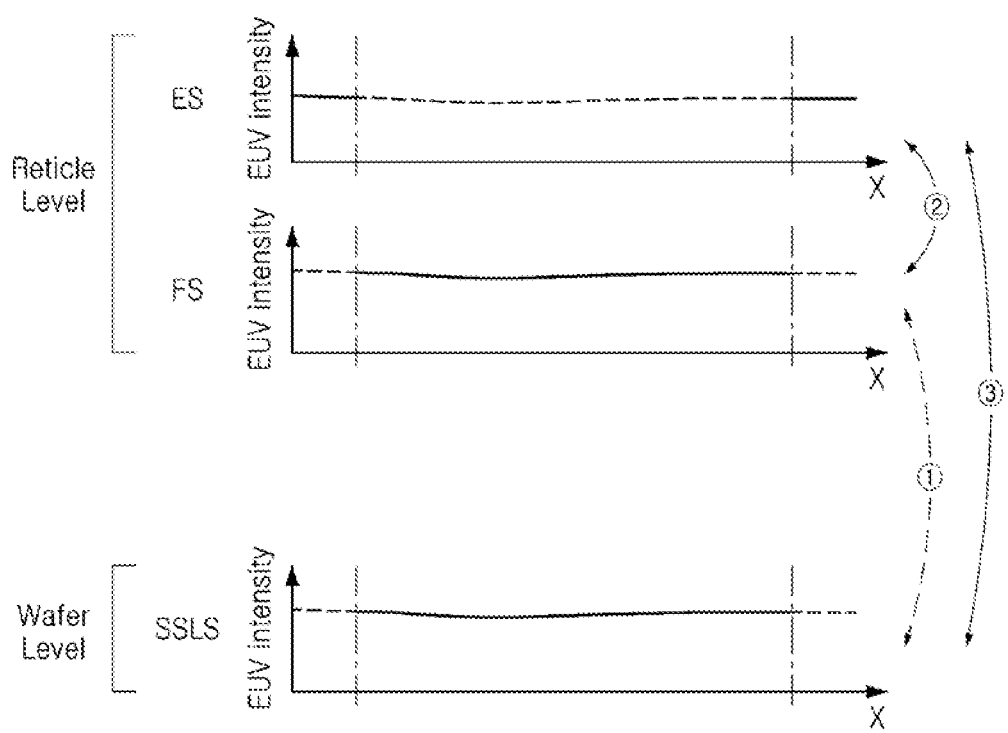
Figure 8C:
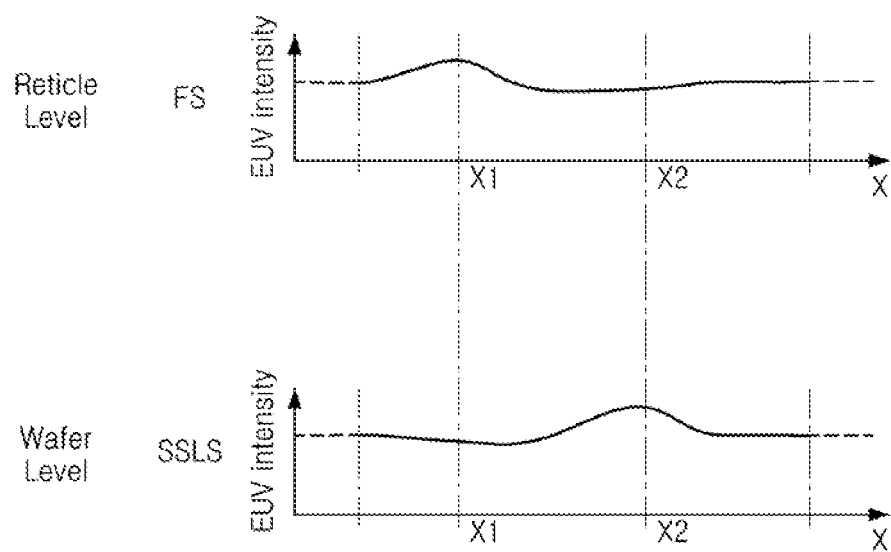

FIGS. 8A to 8C are diagrams illustrating a method of detecting whether there is an abnormality in energy transmission efficiency, aberration, or alignment of the projection system 150 according to an example embodiment of the disclosure.

FIG. 8A illustrates the exposure apparatus 100 according to an example embodiment of the disclosure. The exposure apparatus 100 may include the radiation source 110, the illumination system 120, the reticle stage 130, the illumination correction apparatus 140, the projection system 150, and the wafer stage 160, as described with reference to FIG. 1. In the exposure apparatus 100, movement path of the radiation beam B is indicated by a broken line. The exposure apparatus 100 may further include the optical sensors SS, ES, FS, and SSLS and the monitoring unit 170. The optical sensors SS, ES, FS, and SSLS and the monitoring unit 170 may be electrically connected to each other, and a structure of electrical connection between the optical sensors SS, ES, FS, and SSLS and the monitoring unit 170 is indicated by a solid line.

The monitoring unit 170 may obtain intensity information determined based on output signals of the optical sensors SS, ES, FS, and SSLS, may calculate, based on the intensity information, energy transmission efficiency of an optical system such as the illumination system 120 or the projection system 150m, and may detect whether the optical system is abnormal.

FIG. 8B is a diagram illustrating a method of calculating energy transmission efficiency of the projection system 150.

FIG. 8B illustrates intensities of the radiation beam B depending on a position in the first direction X, measured by the energy sensor ES, the finger sensor FS, and the slit-spot sensor SSLS. The energy sensor ES and the finger sensor FS may be included in the illumination correction apparatus 140 to measure an intensity of the radiation beam B on a reticle level, and the slit-spot sensor SSLS may be included in the wafer stage 160 to measure an intensity of the radiation beam B on a wafer level.

The energy transmission efficiency of the projection system 150 may be calculated according to Equation 1 below.

$$(POB \text{ transmission}) = \frac{(Energy@wafer)}{(Energy@reticle)} = \frac{(Energy@SSLS)}{(Energy@FS)} \quad [\text{Equation 1}]$$

In Equation 1, (POB transmission) represents energy transmission efficiency of the projection system 150, (Energy@wafer) represents energy of the radiation beam B on the wafer level, and (Energy@reticle) represents energy of the radiation beam B on the reticle level. That is, the energy transmission efficiency of the projection system 150 may indicate an amount of energy of the radiation beam B on the reticle level being transmitted to a wafer.

The energy of the radiation beam B on the reticle level may correspond to energy of a main portion of the radiation beam B output from the illumination system 120. Thus, the energy of the radiation beam B on the reticle level may be determined from the intensity of the radiation beam B measured by the finger sensors FS. The energy of the radiation beam B on the wafer level may correspond to the intensity of the radiation beam B in a position corresponding to the main portion. The energy of the radiation beam B on the wafer level may be determined from the intensity of the radiation beam B measured by the slit-spot sensor SSLS.

It may be difficult for the finger sensor FS to measure intensity in a desired position in real time during an exposure operation. Conversely, the energy sensor ES may not directly measure an intensity of the radiation beam B in the main portion, but may measure an intensity of the radiation beam B at opposite ends in real time.

According to an example embodiment of the disclosure, a proportional constant for a magnitude of the intensity in the opposite ends and a magnitude of the intensity in the main portion may be determined such that the energy sensor ES estimates the intensity in the main portion by measuring the intensity at the opposite ends.

The illumination correction apparatus 140 may periodically measure the intensity in the main portion. For example, an exposure operation may not be performed when the illumination correction apparatus 140 performs a uniformity correction operation on a radiation beam. When performing the uniformity correction operation, the illumination correction apparatus 140 may measure the intensity in the main portion by moving the plurality of fingers 141 to expose the finger sensors FS to the radiation beam. In addition, according to a result of the measurement, positions of the plurality of fingers 141 may be controlled such that the intensity in the main portion is uniform in the first direction X. The uniformity correction operation may be performed on a daily basis, for example.

The intensity in the main portion may be periodically measured, and a proportional constant between the intensity in the main portion and the intensity at the opposite ends may be periodically updated according to Equation 2 below.

$$C = \frac{(Energy@FS)}{(Energy@ES)} \quad [\text{Equation 2}]$$

In Equation 2, C represents a proportional constant, (Energy@FS) represents the intensity in the main portion, and (Energy@ES) may represent the intensity of the opposite ends measured by the energy sensor ES.

Even when the intensity in the main portion and the intensity at the opposite ends change over time, the intensity in the main portion may be estimated by measuring the intensity at the opposite ends when the proportional constant is periodically updated. The monitoring unit 170 may calculate the energy transmission efficiency of the projection system 150 based on the intensity at the opposite ends measured by the energy sensor ES in real time and the intensity on the wafer level measured by the slit-spot sensor SSLS. The energy transmission efficiency of the projection system can be calculated based on [Equation 3] below.

$$(POB \text{ transmission}) = C * \frac{(Energy@ES)}{(Energy@SSLS)} \quad [\text{Equation 3}]$$

In Equation 3, (POB transmission) represents the energy transmission efficiency of the projection system 150, (Energy@ES) represents the intensity measured by the energy sensor ES, and (Energy@SSLS) represents the intensity measured by the slit-spot sensor SSLS.

According to an example embodiment of the disclosure, the monitoring unit 170 may obtain intensity information of the radiation beam B from the optical sensors ES, FS, and SSLS. The monitoring unit 170 may update a proportional constant when the intensity in the main portion is measured by the finger sensor FS, and may apply the proportional constant to an intensity measured in real time by the energy sensor ES, thereby calculating energy transmission efficiency of the projection system 150 in real time.

When the energy transmission efficiency of the projection system 150 falls below a threshold value, the monitoring unit 170 may detect an abnormality in the projection system 150 and generate a warning signal. In response to the warning signal, the projection system 150 may be repaired or replaced in a timely manner, and a yield of a wafer patterned using the exposure apparatus 100 may be improved.

FIG. 8C is a diagram illustrating a method of detecting whether there is an abnormality in aberration or alignment of the projection system 150.

FIG. 8C illustrates intensities of the radiation beam B depending on a position in the first direction X, measured by the finger sensor FS and the slit-spot sensor SSLS. Referring to FIG. 8C, an intensity of the radiation beam B measured by the finger sensor FS may vary depending on a position of the radiation beam B in the first direction X.

The radiation beam B incident on a position of the finger sensor FS, a radiation beam of the main portion, may be a radiation beam actually incident on a reticle. The radiation beam incident on the reticle may be reflected through the mirrors of projection system 150 to be incident on a wafer.

When there is no abnormality in aberration or alignment of the mirrors included in the projection system 150, an intensity profile measured by the finger sensor FS and an intensity profile measured by the slit-spot sensor SSLS may have similar patterns. For example, when an intensity in a first position X1 of the radiation beam B is high in the intensity profile measured by the finger sensor FS, the intensity in the first position X1 may be high even in the intensity profile measured by the slit spot sensor SSLS.

However, as in the example of FIG. 8C, the intensity in the first position X1 of the radiation beam B may be high in the intensity profile measured by the finger sensor FS. Conversely, an intensity in a second position X2, different from the first position X1, may be high in the intensity profile measured by the slit-spot sensor SSLS. When there is an abnormality in aberration or alignment of the mirrors included in the projection system 150, the intensity profiles of the finger sensor FS and the slit-spot sensor SSLS may have different patterns.

According to an example embodiment of the disclosure, the monitoring unit 170 may detect an abnormality in aberration or alignment of the mirrors included in the projection system 150 by analyzing the intensity profiles of the finger sensors FS and the slit-spot sensor SSLS. The monitoring unit 170 may detect an abnormality in the projection system 150 and generate a warning signal. In response to the warning signal, the projection system 150 may be repaired or replaced in a timely manner, and a yield of a wafer patterned using the exposure apparatus 100 may be improved.

As described with reference to FIGS. 1 to 8C, the illumination correction apparatus 140 of the exposure apparatus 100 may include the finger sensors FS, optical sensors, on the surfaces of the plurality of fingers 141, and may measure the intensity of the radiation beam B incident on the reticle using the fingers sensors FS. In addition, the exposure apparatus 100 may detect, based on the intensity of the radiation beam B measured using the finger sensors FS, whether the projection system 150 is abnormal.

Positions of the finger sensors FS in the plurality of fingers 141 and the number of finger sensors FS may be implemented in various manners. Hereinafter, a structure of an illumination correction apparatus according to various example embodiments of the disclosure will be described with reference to FIGS. 9A to 15.

Figure 9A:
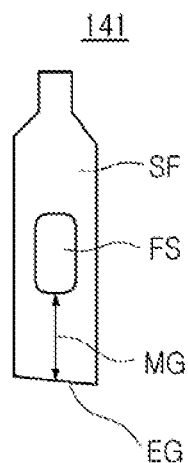
FIGS. 9A to 9D, 10A to 10C, 11A, 11B, and 12 to 16 are diagrams illustrating a structure of an illumination correction apparatus according to example embodiments of the disclosure.
Figure 9B:
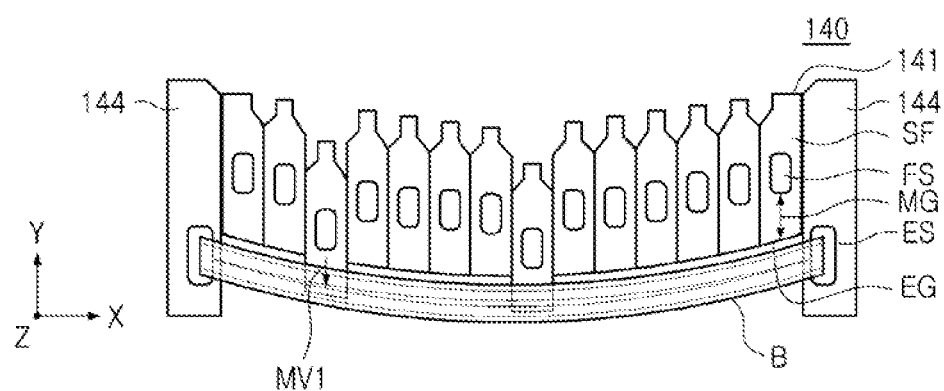
Figure 9C:
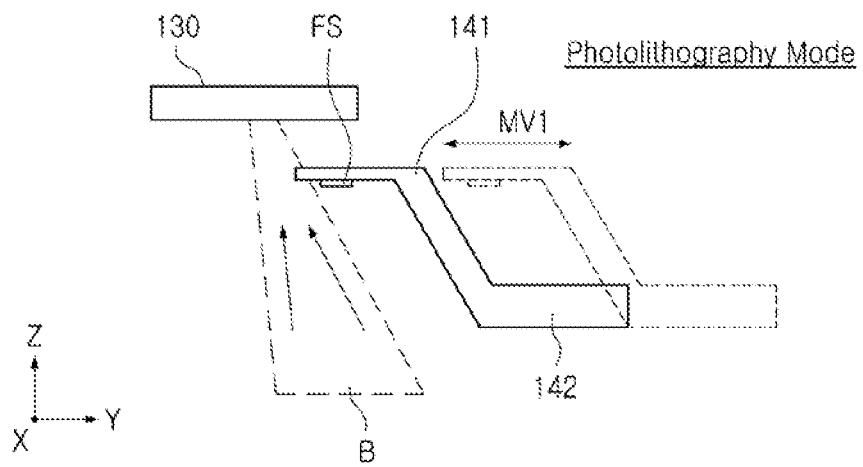
Figure 9D:
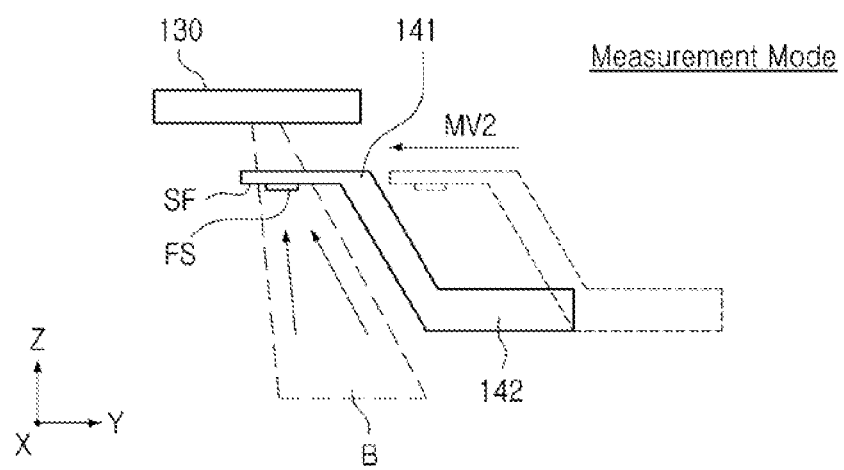

FIGS. 9A to 9D are diagrams illustrating an illumination correction apparatus according to a first example embodiment of the disclosure. FIG. 9A illustrates one finger 141 among a plurality of fingers that may be included in the illumination correction apparatus 140. FIG. 9B is a plan view of the illumination correction apparatus 140 on an X-Y plane. FIGS. 9C and 9D are plan views of a portion of the exposure apparatus 100 in Y-Z plane.

Referring to FIG. 9A, the finger 141 may include a surface SF and a distal edge EG. The finger sensor FS may be disposed on the surface SF of the finger 141 and spaced apart from the distal edge EG by a predetermined distance MG.

Referring to FIG. 9B, the illumination correction apparatus 140 may include the plurality of fingers 141 such as the finger 141 described with reference to FIG. 9A, and the support 144 adjacent to the plurality of fingers 141. The surface SF of the finger 141 may be oriented toward the radiation beam B, and the distal edge EG may be adjacent to an incident path of the radiation beam B.

During an exposure operation, the illumination correction apparatus 140 may move the plurality of fingers 141 within a range of a first length MV1 (e.g., an exposure distance) to cover an edge of the radiation beam B. According to the first example embodiment of the disclosure, the distance MG between the finger sensor FS and the distal edge EG being spaced from each other may be greater than the first length MV1 along which the finger 141 moves during the exposure operation.

Referring to FIG. 9C, in an exposure mode in which the exposure apparatus 100 performs an exposure operation, the finger 141 may cover the edge of the radiation beam B while moving within the range of the first length MV1 in the second direction Y. The surface SF of the finger 141 may be oriented in an incident direction of the radiation beam B. However, the finger sensor FS may not be exposed to the radiation beam B.

Referring to FIG. 9D, in a measurement mode in which the exposure apparatus 100 measures an intensity of the radiation beam B incident on a reticle, the finger 141 may move by a second length MV2 (e.g., a measurement distance) greater than the first length MV1 in the second direction Y. When the finger 141 moves by the second length MV2, the finger sensor FS may be exposed to the radiation beam B, and may generate an output depending on the intensity of the radiation beam B. When the exposure apparatus 100 performs a uniformity correction operation on the radiation beam B incident on the reticle, the exposure apparatus 100 may operate in the measurement mode.

According to the first example embodiment of the disclosure, the finger sensor FS may be exposed to the radiation beam B only in the measurement mode, thereby alleviating degradation of the finger sensor FS caused by the radiation beam B.

Figure 10A:
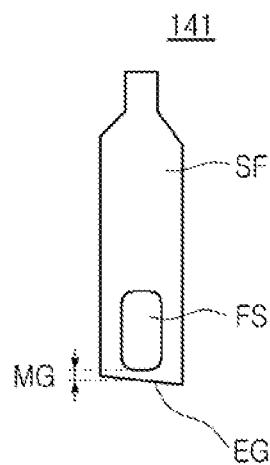
Figure 10B:
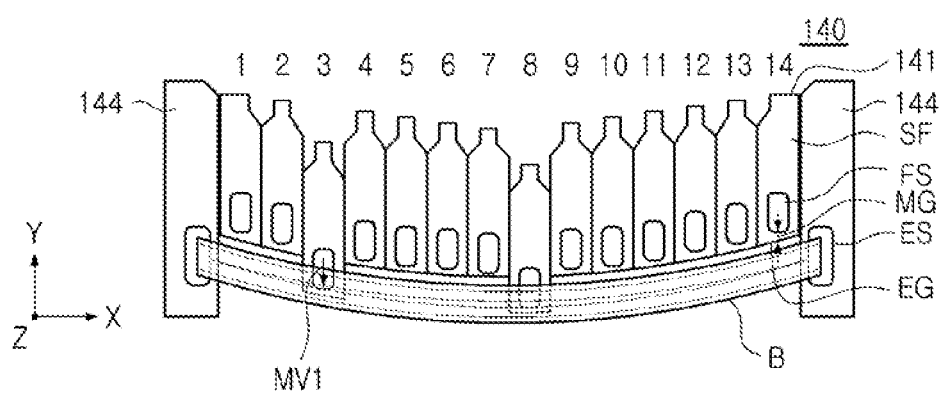
Figure 10C:
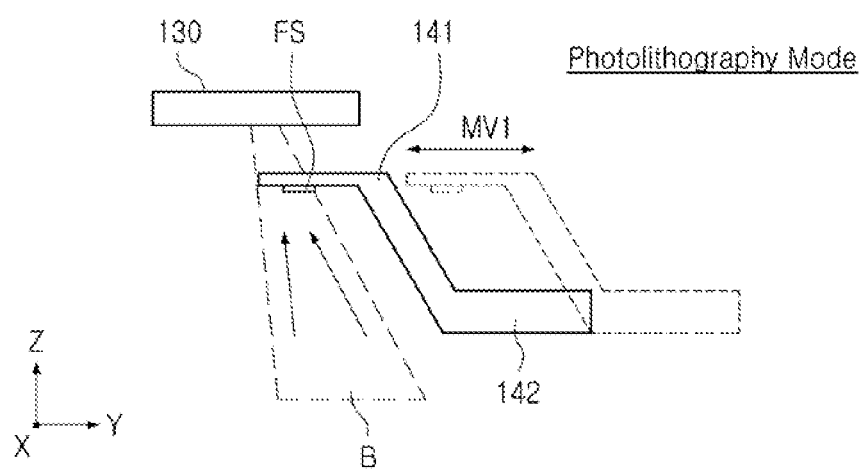

FIGS. 10A to 10C are diagrams illustrating an illumination correction apparatus according to a second example embodiment of the disclosure. FIG. 10A illustrates one finger 141 among a plurality of fingers that may be included in the illumination correction apparatus 140. FIG. 10B is a plan view of the illumination correction apparatus 140 on an X-Y plane. FIG. 10C is a plan view of a portion of the exposure apparatus 100 in a Y-Z plane.

The finger 141 and the finger sensor FS of FIG. 10A may have structures similar to those of the finger 141 and the finger sensor FS described with reference to FIG. 9A. However, FIGS. 9A and 10A may be different from each other in terms of the distance MG between the finger sensor FS and the distal edge EG.

The illumination correction apparatus 140 of FIG. 10B may have a similar structure to the illumination correction apparatus 140 described with reference to FIG. 9B. However, the plurality of fingers 141 included in the illumination correction apparatus 140 of FIG. 10B may have a structure the same as that of the finger 141 described with reference to FIG. 10A.

During an exposure operation, the illumination correction apparatus 140 may move the plurality of fingers 141 within a range of the first length MV1 to cover an edge of the radiation beam B. According to the second example embodiment of the disclosure, the distance MG between the finger sensor FS and the distal edge EG may be shorter than the first length MV1 along which the finger 141 moves during the exposure operation.

Referring to FIG. 10C, in an exposure mode in which the exposure apparatus 100 performs an exposure operation, the finger 141 may cover the edge of the radiation beam B while moving within the range of the first length MV1 in the second direction Y. Depending on a position of the finger 141 in the second direction Y, the finger sensor FS may be exposed to the radiation beam B.

According to the second example embodiment of the disclosure, information about an intensity in a main portion of the radiation beam B may be collected based on an output of the finger sensor FS in the exposure mode. Referring to FIG. 10B, a third finger and an eighth finger may move in the second direction Y such that the radiation beam B has a uniform intensity in the first direction X. While the finger sensors FS of the third and eighth fingers are exposed to the radiation beam B, information about intensities of the radiation beam B in positions of the third and eighth fingers may be collected. According to the second example embodiment of the disclosure, intensity information of the radiation beam B incident on a reticle may be collected not only in the measurement mode but also in the exposure mode.

Figure 11A:
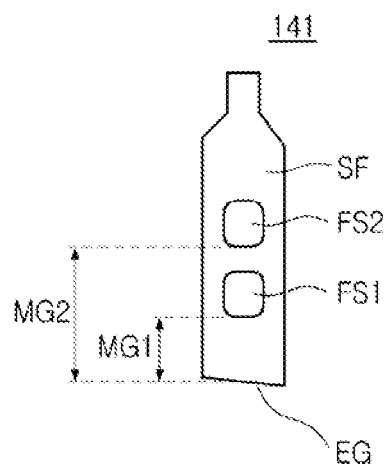
Figure 11B:
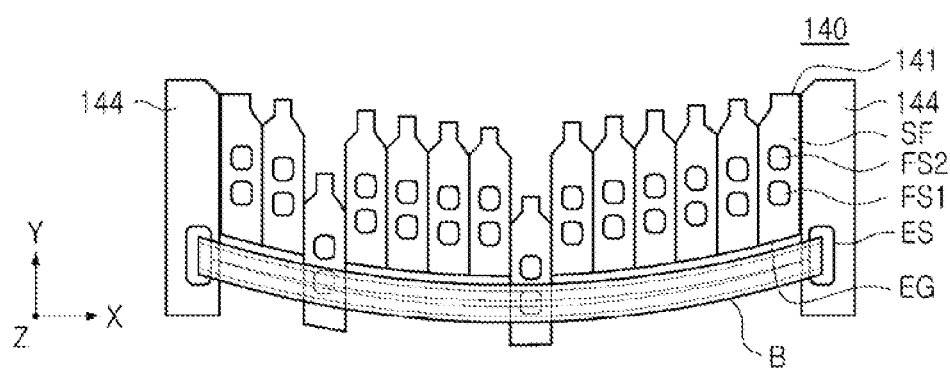

FIGS. 11A and 11B are diagrams illustrating an illumination correction apparatus according to a third example embodiment of the disclosure. FIG. 11A illustrates one finger 141 among a plurality of fingers that may be included in the illumination correction apparatus 140. FIG. 11B is a plan view of the illumination correction apparatus 140 on an X-Y plane.

Referring to FIG. 11A, the finger 141 may include the surface SF and the distal edge EG. According to the third example embodiment of the disclosure, a plurality of finger sensors FS1 and FS2 may be disposed on the surface SF of the finger 141 to be parallel to each other. The first finger sensor FS1 may be spaced apart from the distal edge EG by a first distance MG1, and the second finger sensor FS2 may be spaced apart from the distal edge EG by a second distance MG2 greater than the first distance MG1.

The illumination correction apparatus 140 of FIG. 11B may have a structure similar to that of the illumination correction apparatus 140 described with reference to FIG. 9B. However, the plurality of fingers 141 included in the illumination correction apparatus 140 of FIG. 11B may have a structure the same as that of the finger 141 described with reference to FIG. 11A.

According to the third example embodiment of the disclosure, in a measurement mode, the illumination correction apparatus 140 may control the plurality of fingers 141 such that the first finger sensor FS1 is exposed to the radiation beam B and the second finger sensor FS2 is not exposed to the radiation beam B. Since the second finger sensor FS2 is not exposed to the radiation beam B in the measurement mode, the second finger sensor FS2 may be hardly degraded. Conversely, the first finger sensor FS may be degraded each time the first finger sensor FS is exposed to the radiation beam B in the measurement mode. When the first finger sensor FS is degraded, an intensity of the radiation beam B measured based on an output of the first finger sensor FS may have an inaccurate value.

According to the third example embodiment of the disclosure, the illumination correction apparatus 140 may expose the first finger sensor FS1 and the second finger sensor FS2 to the radiation beam B in a calibration mode. The calibration mode may be performed at a period longer than that of the measurement mode. In the calibration mode, the illumination correction apparatus 140 may compare an output of the first finger sensor FS1 and an output of the second finger sensor FS2 to each other, and may calibrate an intensity of the radiation beam B depending on a result of the comparison. Accordingly, the first finger sensor FS1 may more accurately measure the intensity of the radiation beam B, and may more accurately diagnose whether the projection optical system 150 is abnormal.

Figure 12:
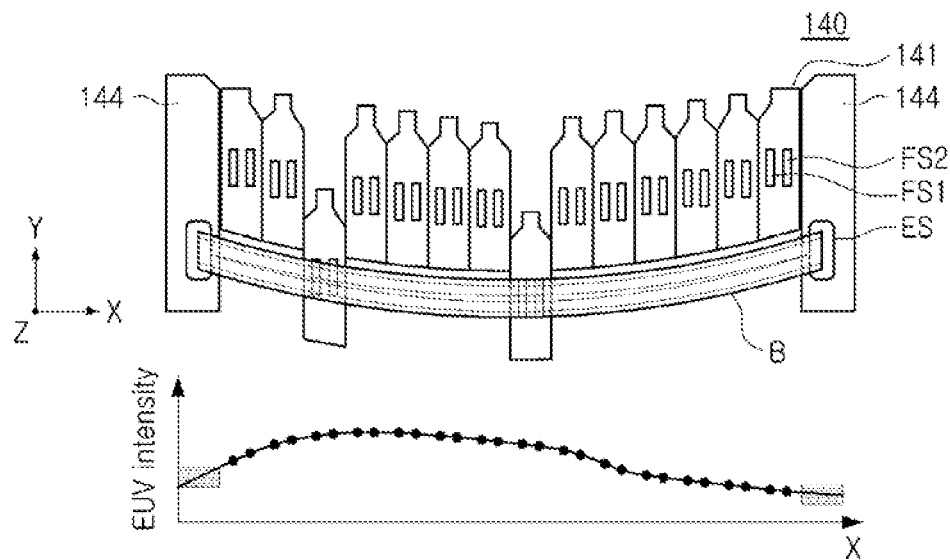

FIG. 12 is a diagram illustrating an illumination correction apparatus according to a fourth example embodiment of the disclosure. The illumination correction apparatus 140 of FIG. 12 may have a structure similar to that of the illumination correction apparatus 140 described with reference to FIG. 11B. However, each of the plurality of fingers 141 included in the illumination correction apparatus 140 of FIG. 11B may include two finger sensors parallel to each other in the second direction Y. Conversely, two finger sensors FS1 and FS2 parallel to each other in the first direction X may be disposed on each of the plurality of fingers 141 included in the illumination correction apparatus 140 of FIG. 12.

According to the fourth example embodiment of the disclosure, the illumination correction apparatus 140 may measure an intensity of the radiation beam B depending on a position in the first direction X using the finger sensors FS1 and FS2 disposed on each of the plurality of fingers 141.

FIG. 12 also illustrates a graph illustrating an intensity of the radiation beam B depending on a position in the first direction X. Dots in the graph of FIG. 12 represent intensities of the radiation beam B measured by the finger sensors FS1 and FS2, disposed on each of the plurality of fingers 141, in a position in the first direction X. In addition, a solid line in the graph of FIG. 12 represents an intensity profile of the radiation beam B.

According to the fourth example embodiment of the disclosure, the plurality of fingers 141 include the plurality of finger sensors FS parallel to each other in the first direction X, thereby measuring intensities in various positions in the first direction X, and the intensity profile of the radiation beam B configured based on the intensities of the radiation beam B measured by the finger sensors FS may have improved resolution.

Figure 13:
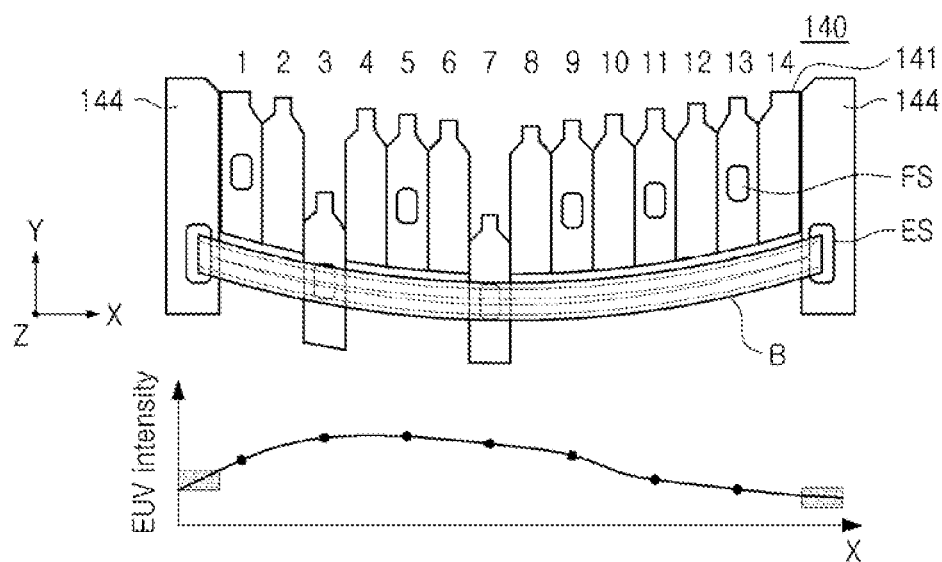

FIG. 13 is a diagram illustrating an illumination correction apparatus according to a fifth example embodiment of the disclosure. The illumination correction apparatus 140 of FIG. 13 may have a structure similar to that of the illumination correction apparatus described with reference to FIG. 9B. However, in the illumination correction apparatus 140 of FIG. 13, the finger sensors FS may be disposed only in some fingers of the plurality of fingers 141.

In the example of FIG. 13, the finger sensors FS may be disposed on odd-numbered fingers among the plurality of fingers 141. That is, fingers having surfaces on which of the finger sensors FS are disposed and fingers having surfaces on which the finger sensors FS are not disposed may be alternately disposed.

FIG. 13 also illustrates a graph illustrating an intensity of the radiation beam B depending on a position in the first direction X. Dots in the graph of FIG. 13 represent intensities measured by the finger sensors FS, disposed in some fingers among the plurality of fingers 141, in a position of the first direction X. In addition, a solid line in the graph of FIG. 13 represents an intensity profile of the radiation beam B.

When comparing FIG. 12 and FIG. 13 to each other, in FIG. 13, an amount of intensity information for forming an intensity profile may be limited. According to the fifth example embodiment of the disclosure, an intensity profile of the radiation beam B incident on a reticle may be formed at low cost by interpolating intensity information of the radiation beam B measured by the finger sensors FS.

Figure 14:
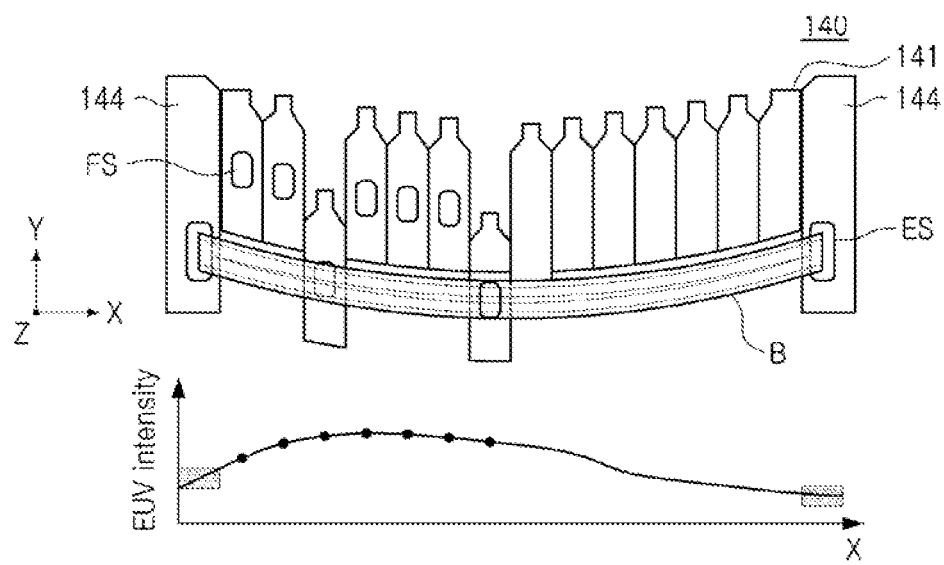

FIG. 14 is a diagram illustrating an illumination correction apparatus according to a sixth example embodiment of the disclosure. The illumination correction apparatus 140 of FIG. 14 may have a structure similar to that of the illumination correction apparatus 140 described with reference to FIG. 13, and some of the fingers 141 may include the finger sensors FS disposed thereon. However, in the illumination correction apparatus 140 of FIG. 14, fingers having surfaces on which the finger sensors FS are disposed may be disposed to be adjacent to each other.

According to the sixth example embodiment of the disclosure, the finger sensors FS and wires for connecting the finger sensors FS to the illumination correction apparatus 140 may be centrally disposed in limited positions, thereby securing a mechanical space of the exposure apparatus 100.

Figure 15:
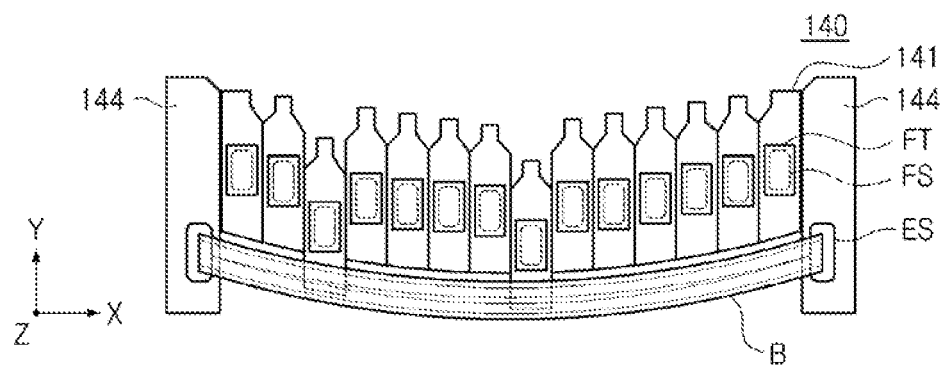

FIG. 15 is a diagram illustrating an illumination correction apparatus according to a seventh example embodiment of the disclosure. The illumination correction apparatus 140 of FIG. 15 may have a structure similar to that of the illumination correction apparatus 140 described with reference to FIG. 9B. However, the illumination correction apparatus 140 of FIG. 15 may further include optical filters FT, as compared to the illumination correction apparatus 140 of FIG. 9B. The optical filters FT may be disposed to cover upper surfaces of the finger sensors FS respectively disposed on surfaces of the plurality of fingers 141.

For example, when the exposure apparatus 100 is an EUV exposure apparatus performing an exposure operation using an EUV beam having a wavelength of about 13.5 nm, the optical filters FT may selectively transmit a radiation beam having a wavelength of about 13.5 nm. According to the seventh example embodiment of the disclosure, even when beams having various wavelengths are mixed in the radiation beam B incident on a reticle, the finger sensors FS may accurately measure an intensity of the EUV beam for patterning the reticle.

The optical filter FT according to the seventh example embodiment of the disclosure may be applied to the finger sensors FS according to various example embodiments of the disclosure described with reference to FIGS. 9A to 14.

Figure 16:
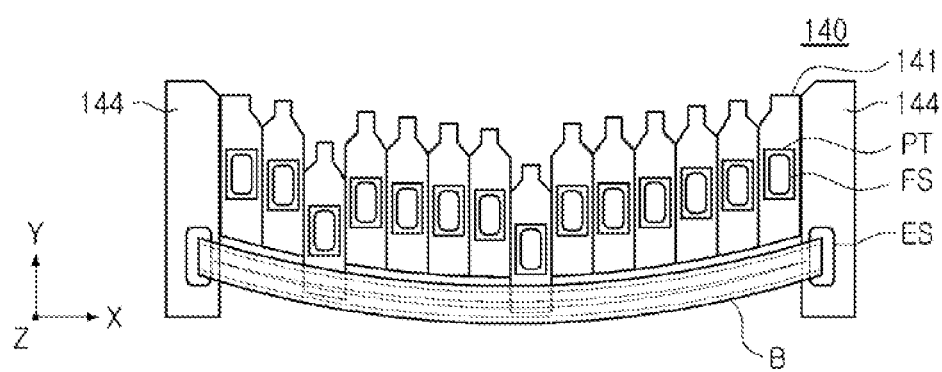

FIG. 16 is a diagram illustrating an illumination correction apparatus according to an eighth example embodiment of the disclosure.

The illumination correction apparatus 140 of FIG. 16 may further include a Peltier device (PT). The Peltier device (PT) may have opposite surfaces. When a DC current flows through the Peltier device, one surface of the Peltier device (PT) may become colder and the other surface may become hotter, due to the Peltier effect. According to an example embodiment of the disclosure, one surface of the Peltier device (PT) may be attached to a surface of the finger sensor FS oriented toward the finger 141, and the other surface of the Peltier device (PT) may be attached to a surface (e.g., an opposite surface) of the finger 141. The Peltier device (PT) may effectively alleviate heat generated when the finger sensor FS performs photoelectric conversion.

In addition, in FIGS. 9A to 16, as described with reference to FIG. 5A, various example embodiments of the disclosure have been described taking, as an example, a case in which the illumination correction apparatus 140 includes one layer of fingers 141, but the disclosure is not limited thereto. For example, various example embodiments of the disclosure described with reference to FIGS. 9A to 16 may also be applied to a case in which the illumination correction apparatus 140 includes two or more staggered layers of fingers, as described with reference to FIG. 5C.

According to various example embodiments of the disclosure described above, the finger sensor FS may be disposed on at least one finger, among the plurality of fingers 141 of the illumination correction apparatus 140 of the exposure apparatus 100. The illumination correction apparatus 140 may control movement of the finger on which the finger sensor FS is disposed, thereby measuring a position-dependent intensity of the radiation beam B on a path of the radiation beam B incident on a reticle. When the plurality of fingers 141 do not cover an incident path of the radiation beam B during an exposure operation, the finger sensor FS may not measure the intensity, thereby preventing energy loss of the radiation beam B incident on the reticle for the exposure operation.

According to an example embodiment of the disclosure, the exposure apparatus 100 may monitor, based on an intensity measured by the finger sensor FS and an intensity measured by the slit-spot sensor SSLS on a wafer side, whether the projection system 150 is abnormal. Accordingly, the projection system 150 may be repaired or replaced in a timely manner, and a yield of a wafer exposed by the exposure apparatus 100 may be improved.

According to example embodiments, at least one of the components illustrated in the drawing, e.g., the controller 143 in FIG. 2, the measurement unit 200 in FIG. 5A, etc. may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like.

While example embodiments have been shown and described above, it will be apparent to those skilled in the art that modifications and variations could be made without departing from the scope of the disclosure as defined by the appended claims.

What is claimed is:

1. An illumination correction apparatus configured to correct a radiation beam incident on a reticle from an exposure apparatus, the illumination correction apparatus comprising:

a plurality of fingers each having a surface facing an incident direction of the radiation beam, the plurality of fingers being arranged in a first direction to be adjacent to a path of the radiation beam, and configured to adjust an amount of the incident radiation beam by moving in a second direction intersecting the first direction;

a controller connected to the plurality of fingers, and configured to control movement of the plurality of fingers such that an intensity of the radiation beam has uniformity in the first direction;

a plurality of optical sensors comprising a first optical sensor and a second optical sensor on the surface of a finger of the plurality of fingers; and a measurement unit configured to:
measure the intensity of the radiation beam based on an output of the plurality of optical sensors, and
calibrate the intensity of the radiation beam based on a comparison between an output of the first optical sensor and an output of the second optical sensor.

2. The illumination correction apparatus of claim 1, wherein:
each of the plurality of fingers further comprises a distal edge adjacent to the path of the radiation beam, and
the plurality of optical sensors are on a surface of the finger and are spaced apart from the distal edge by a first distance in the second direction.

3. The illumination correction apparatus of claim 2, wherein:
the controller is configured to control the plurality of fingers to move an exposure distance in an exposure mode, and to control the plurality of fingers to move a measurement distance, greater than the exposure distance in a measurement mode, and
the first distance is greater than the exposure distance and is less than the measurement distance.

4. The illumination correction apparatus of claim 1, wherein:
each of the plurality of fingers further comprises a distal edge adjacent to the path of the radiation beam, and
the first optical sensor is on the surface of the finger spaced apart from the distal edge by a first distance in the second direction, and the second optical sensor is on the surface of the finger spaced apart from the distal edge by a second distance greater than the first distance in the second direction.

5. The illumination correction apparatus of claim 4, wherein:
the controller is configured to control the plurality of fingers such that the first optical sensor is exposed to the radiation beam and the second optical sensor is not exposed to the radiation beam in a measurement mode, and to control the plurality of fingers such that the first optical sensor and the second optical sensor are exposed to the radiation beam in a calibration mode.

6. The illumination correction apparatus of claim 1, wherein the illumination correction apparatus further comprises:
a support configured to surround the plurality of fingers in the first direction, the support having a surface facing the incident direction of the radiation beam; and
at least one energy sensor on the surface of the support.

7. The illumination correction apparatus of claim 1, wherein the plurality of optical sensors comprises a photodiode configured to perform photoelectric conversion on a radiation beam of 10 nm to 30 nm.

8. The illumination correction apparatus of claim 1, wherein the illumination correction apparatus further comprises a plurality of optical filters attached to a surface of the plurality of optical sensors.

9. The illumination correction apparatus of claim 8, wherein the plurality of optical filters are configured to selectively transmit an extreme ultraviolet (EUV) beam.

10. The illumination correction apparatus of claim 1, wherein the illumination correction apparatus further comprises Peltier devices on a surface of the plurality of optical sensors oriented toward the at least one finger.

11. The illumination correction apparatus of claim 1, wherein the measurement unit is configured to output, based on the output of the plurality of optical sensors, an intensity profile representing the intensity of the radiation beam depending on a position of the radiation beam in the first direction.

12. The illumination correction apparatus of claim 11, wherein the controller is configured to control, based on the intensity profile output by the measurement unit, the movement of the plurality of fingers such that the intensity of the radiation beam has uniformity in the first direction.

13. The illumination correction apparatus of claim 1, wherein the measurement unit comprises:
a signal amplifier configured to generate a current signal or a voltage signal by amplifying a signal photoelectrically converted from the plurality of optical sensors; and
a detector configured to determine, based on the current signal or the voltage signal, the intensity of the radiation beam.

14. The illumination correction apparatus of claim 1, wherein a respective one of the plurality of optical sensors is on a surface of each of the plurality of fingers.

15. The illumination correction apparatus of claim 1, wherein a respective one of the plurality of optical sensors is on a surface of some of the plurality of fingers.

16. The illumination correction apparatus of claim 1, wherein each of the plurality of optical sensors has a length of 1 μm or more and 1 cm or less in the first direction.

17. An illumination correction apparatus configured to correct a radiation beam incident on a reticle from an exposure apparatus, the illumination correction apparatus comprising:
a plurality of fingers configured to adjust an intensity of the radiation beam incident on the reticle with movement of the plurality of fingers in a predetermined direction;
an energy sensor adjacent to the plurality of fingers; and
a plurality of optical sensors on a surface of at least one finger, among the plurality of fingers,
wherein the illumination correction apparatus is configured to determine a relation between the intensity at opposite ends of the radiation beam and the intensity of a main portion of the radiation beam, and measure the intensity at the opposite ends of the radiation beam using the energy sensor, and estimate, based on the relation, the intensity of the main portion of the radiation beam, and
the intensity of the radiation beam on the reticle level is used to monitor energy transmission efficiency of a projection system of the exposure apparatus.

18. The illumination correction apparatus of claim 17, wherein the illumination correction apparatus is configured to control the plurality of fingers such that the plurality of optical sensors are not exposed to the radiation beam incident on the reticle in an exposure mode, and to control the plurality of fingers such that the plurality of optical sensors are exposed to the radiation beam in a measurement mode.

19. The illumination correction apparatus of claim 18, wherein the illumination correction apparatus is configured to:

in the measurement mode, measure an intensity at opposite ends of the radiation beam using the energy sensor, measure an intensity in a main portion of the radiation beam using the plurality of optical sensors, and determine a proportional constant between the intensity at the opposite ends of the radiation beam and the intensity of the main portion of the radiation beam; and in the exposure mode, measure the intensity at the opposite ends of the radiation beam using the energy sensor, and estimate, based on the proportional constant, the intensity of the main portion of the radiation beam.

20. An illumination correction apparatus configured to correct a radiation beam incident on a reticle from an exposure apparatus, the illumination correction apparatus comprising:

a plurality of fingers configured to adjust an amount of the radiation beam incident on the reticle with movement of the plurality of fingers in a predetermined direction;

an energy sensor adjacent to the plurality of fingers; and a plurality of optical sensors comprising a first optical sensor and a second optical sensor on a surface of a finger, among the plurality of fingers, wherein the illumination correction apparatus is configured to measure a reticle-level intensity profile representing a position-dependent intensity of the radiation beam incident on the reticle using the energy sensor and the plurality of optical sensors, and to calibrate the intensity of the radiation beam based on a comparison between an output of the first optical sensor and an output of the second optical sensor, and wherein the reticle-level intensity profile is used to monitor whether there is an abnormality in aberration or alignment of a projection system.

* * * * *